United States Patent
Wang et al.

(10) Patent No.: US 9,379,929 B2
(45) Date of Patent: Jun. 28, 2016

(54) PHASE IMBALANCE CALIBRATION

(71) Applicant: QUALCOMM Incorporated, San Diego, CA (US)

(72) Inventors: Cheng-Han Wang, San Jose, CA (US); I-Liang Lin, Fremont, CA (US); Liang Zhao, Sunnyvale, CA (US); Hong Sun Kim, San Jose, CA (US); Yi Zeng, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 113 days.

(21) Appl. No.: 14/220,425

(22) Filed: Mar. 20, 2014

(65) Prior Publication Data

US 2015/0271005 A1   Sep. 24, 2015

(51) Int. Cl.
| | |
|---|---|
| H04B 1/10 | (2006.01) |
| H04L 27/34 | (2006.01) |
| H04L 27/36 | (2006.01) |
| H03D 3/00 | (2006.01) |

(52) U.S. Cl.
CPC ............ *H04L 27/3405* (2013.01); *H03D 3/008* (2013.01); *H03D 3/009* (2013.01); *H04L 27/364* (2013.01); *H03C 2200/0041* (2013.01); *H03D 2200/0045* (2013.01)

(58) Field of Classification Search
CPC ... H04L 27/3863; H04L 27/364; H03D 3/009
USPC .......................................................... 375/254
See application file for complete search history.

(56) References Cited

U.S. PATENT DOCUMENTS

| | | | |
|---|---|---|---|
| 7,209,526 B2 | 4/2007 | Kim et al. | |
| 7,336,730 B2 | 2/2008 | Auranen et al. | |
| 7,917,091 B2 | 3/2011 | Montemayor et al. | |
| 2006/0176975 A1 | 8/2006 | Hsieh et al. | |
| 2008/0025381 A1* | 1/2008 | Lee .......................... | H04B 1/30 375/219 |
| 2008/0205502 A1 | 8/2008 | Lee et al. | |
| 2011/0009080 A1 | 1/2011 | Seendripu et al. | |
| 2011/0064166 A1* | 3/2011 | Khoshgard ......... | H04L 27/3863 375/324 |

OTHER PUBLICATIONS

Durec J., et al., "A self calibrating quadrature generator with wide frequency range", Radio Frequency Integrated Circuits (RFIC) Symposium, 1997, Jun. 10, 1997, pp. 147-151, XP032380666, New York, NY, USA,IEEE, US DOI: 10.1109/RFIC.1997.598763, ISBN: 978-0-7803-4063-3.

International Search Report and Written Opinion—PCT/US2015/017079—ISA/EPO—May 6, 2015.

Valero-Lopez A.Y., et al., "Self-Calibrated Quadrature Generator for WLAN Multi standard Frequency Synthesizer", IEEE Journal of Solid-State Circuits, vol. 41, No. 5, May 1, 2006, pp. 1031-1041, XP55005144,ISSN: 0018-9200, DOI: 10.1109/JSSC.2006.872712.

* cited by examiner

*Primary Examiner* — David S Huang
(74) *Attorney, Agent, or Firm* — Patterson & Sheridan, L.L.P.

(57) ABSTRACT

A circuit for performing a residual side band calibration is described. The circuit generally includes a phase imbalance detection circuit. The phase imbalance detection circuit may include a limiter. The phase imbalance detection circuit may be independent of gain imbalance. The circuit may also include a phase imbalance correction circuit. The phase imbalance detection circuit may control coupling between an inphase path and a quadrature path.

27 Claims, 10 Drawing Sheets

PHASE IMBALANCE CALIBRATION

TECHNICAL FIELD

The present disclosure relates generally to electronic devices. More specifically, the present disclosure relates to systems and methods for performing a phase imbalance calibration.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform new functions and/ or that perform functions faster, more efficiently or with higher quality are often sought after.

An electronic device may include separate branches for the inphase (I) and quadrature (Q) signals. Ideally, the I branch and the Q branch have equal gain with a 90° phase difference from each other. However, imbalances may exist between the I branch and the Q branch. These imbalances may degrade the performance of the electronic device. To correct these imbalances, a calibration may be performed. Benefits may be realized by improvements to the calibration of imbalances between the I branch and the Q branch.

SUMMARY

A circuit for performing a phase imbalance calibration is described. The circuit generally includes a phase imbalance detection circuit that includes a limiter. The phase imbalance detection circuit may be independent of gain imbalance. The circuit may also include a phase imbalance correction circuit. The phase imbalance detection circuit may control coupling between an inphase path and a quadrature path to reduce a phase imbalance.

The phase imbalance correction circuit may include an inphase channel buffer and a quadrature channel buffer. The coupling may occur between an inphase buffer replica and a quadrature buffer output. The coupling may also occur between a quadrature buffer replica and an inphase buffer output. The phase imbalance correction circuit may include multiple switches. Each switch may be controlled by a control signal. Each switch may provide the coupling when closed.

The phase imbalance correction circuit may operate in the analog domain in a baseband filter. The phase imbalance detection circuit may receive analog signals output from a baseband filter.

The phase imbalance detection circuit may include a first limiter that receives an inphase signal. The phase imbalance detection circuit may also include a second limiter that receives a quadrature signal. The phase imbalance detection circuit may further include an XOR gate that receives an output of the first limiter and an output of the second limiter. The phase imbalance detection circuit may also include a comparator that receives an output of the XOR gate and an inverted output of the XOR gate.

The output of the XOR gate and the inverted output of the XOR gate may be passed through a DC extractor prior to being provided to the comparator. The comparator may output an analog signal indicating the phase imbalance in an electronic device. A controller may use the analog signal indicating the phase imbalance to adjust the coupling and reduce the phase imbalance. The coupling may use dual direction coupling both from the inphase path to the quadrature path and from the quadrature path to the inphase path.

A method for residual side band calibration is also described. An analog inphase signal may be obtained. An analog quadrature signal may also be obtained. A phase imbalance between the analog inphase signal and the analog quadrature signal may be detected using a phase imbalance detection circuit that that includes a limiter. The phase imbalance detection circuit may be independent of gain imbalance. Coupling between the analog inphase signal and the analog quadrature signal may be adjusted to reduce a phase imbalance.

The coupling may be adjusted using a phase imbalance correction circuit that includes an inphase channel buffer and a quadrature channel buffer.

An apparatus is further described. The apparatus generally includes means for obtaining an analog inphase signal. The apparatus may also include means for obtaining an analog quadrature signal. The apparatus may further include means for detecting a phase imbalance between the analog inphase signal and the analog quadrature signal. The means for detecting a phase imbalance may include a limiter. The means for detecting a phase imbalance may be independent of gain imbalance. The apparatus may also include means for adjusting coupling between the analog inphase signal and the analog quadrature signal to reduce the phase imbalance.

A computer-program product that includes a non-transitory tangible computer-readable medium having instructions thereon is also described. The instructions may include code for causing an electronic device to obtain an analog inphase signal. The instructions may also include code for causing the electronic device to obtain an analog quadrature signal. The instructions may further include code for causing the electronic device to detect a phase imbalance between the analog inphase signal and the analog quadrature signal using a phase imbalance detection circuit that includes a limiter. The phase imbalance detection circuit may be independent of gain. The instructions may also include code for causing the electronic device to adjust coupling between the analog inphase signal and the analog quadrature signal to reduce the phase imbalance.

DETAILED DESCRIPTION

Figure 1:
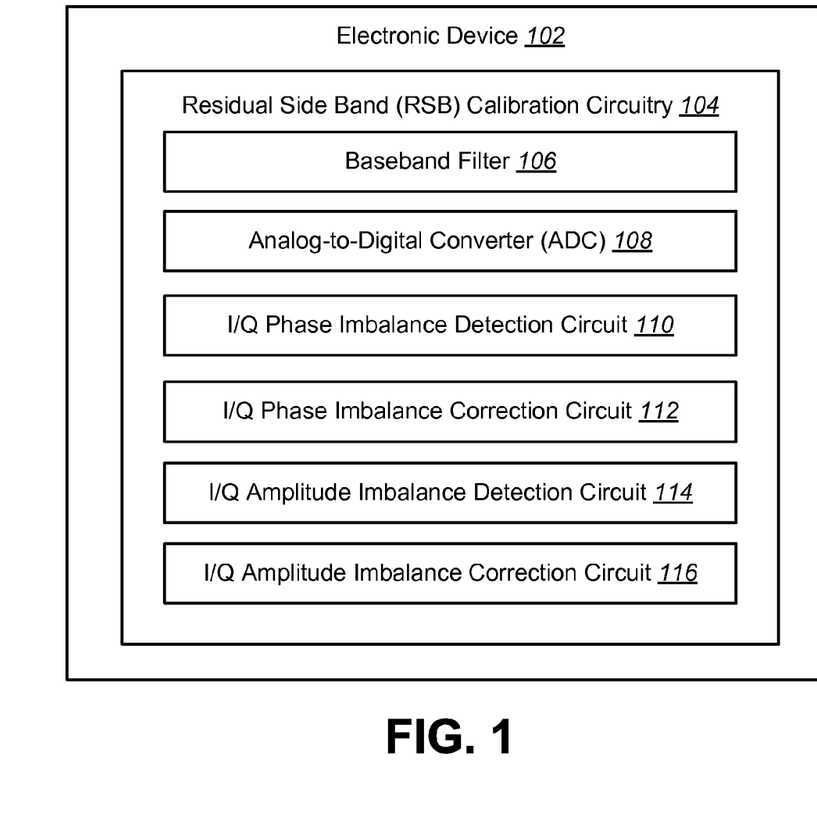
FIG. 1 is a block diagram illustrating one configuration of an electronic device that includes residual side band (RSB) calibration circuitry.

FIG. 1 is a block diagram illustrating one configuration of an electronic device 102 that includes residual side band (RSB) calibration circuitry 104. The RSB calibration circuitry 104 may calibrate RSB in the analog domain without the use of digital circuitry, such as a modem. RSB may be calibrated easily in the digital domain, such as by using a digital signal processing (DSP) unit to calibrate the inphase/quadrature (I/Q) imbalance after the signal is downconverted and digitized. However, this approach may not allow the analog core to close the loop by itself, which may be a desired feature for a low cost system. Thus, there is a need for RSB calibration circuitry 104 that can operate in the analog domain.

The electronic device 102 may be a wireless communication device (such as a cellular phone, a personal digital assistant (PDA), a wireless device, or a handheld device), a camera, a laptop computer, a tablet, a base station, etc. A wireless communication device may also be referred to as, and may include some or all of the functionality of, a terminal, an access terminal, a user equipment (UE), a subscriber unit, a station, etc.

RSB is a combination of amplitude and phase imbalance between the inphase signal and the quadrature signal in I/Q circuitry. The RSB may be defined using Equation (1):

$$RSB \mid dB20 = dB20\left(\sqrt{\frac{1+\alpha^2-2\alpha\cos(\varepsilon)}{1+\alpha^2+2\alpha\cos(\varepsilon)}}\right). \quad (1)$$

The contributors to RB may include local oscillator (LO) generation and the baseband filter 106. The phase imbalance from an LO may exhibit broadband phase error. The phase imbalance from a baseband filter 106 may be frequency dependent. Both I/Q phase imbalance and I/Q amplitude imbalance may be removed by RSB calibration circuitry 104.

The RSB calibration circuitry 104 may include a baseband filter 106, an analog-to-digital converter (ADC) 108, an I/Q phase imbalance detection circuit 110, an I/Q phase imbalance correction circuit 112, an I/Q amplitude imbalance detection circuit 114 and an I/Q amplitude imbalance correction circuit 116. There are many different ways to implement the I/Q amplitude imbalance correction circuit 116 and the I/Q amplitude imbalance detection circuit 114. However, both the I/Q phase imbalance detection circuit 110 and the I/Q phase imbalance correction circuit 112 have traditionally been difficult to implement. In some configurations, the I/Q phase imbalance correction circuit 112 may be referred to as a knob that is used to adjust for I/Q phase imbalance. Both the I/Q phase imbalance detection circuit 110 and the I/Q phase imbalance correction circuit 112 may be implemented on a single analog chip.

According to certain aspects, one way to correct phase imbalance is through the adjustment of a passive mixer gate bias voltage. However, adjusting mixer gate bias voltage is typically used to correct for gain imbalance rather than phase imbalance. Adjusting mixer gate bias voltage may only shift the phase imbalance when a sloppy slow local oscillator (LO) clock slope is used. However, a major side effect of this phase shift may be that the effective duty cycle may change, resulting in a change to the gain. Also, the adjustment amount may a function of the LO clock slope, which may complicate the calibration system.

According to certain aspects, another implementation for adjusting phase imbalance is through the use of LO phase interpolation. LO phase interpolation may be generally considered as an accurate way to calibrate the phase. However, LO phase interpolation may exhibit high power consumption and may thus not be suitable for a mobile radio integrated circuit (IC). The prevailing local oscillation (LO) clock may further complicate the implementation of phase interpolation.

There may be multiple linear delay designs that allow for the adjustment of phase imbalance. However, linear delay cells may entail high current consumption and may not be quite linear. In fact, changing the bias current may introduce a linear-to-frequency delay in the receiver (Rx) chain. In addition, such phase imbalance adjustment may not adjust phase imbalance across a wide frequency range.

Instead of using phase delay cells, delay in the LO clock or LO phase interpolation, the I/Q phase imbalance correction circuit 112 may implement a phase interpolation function at the baseband. By introducing coupling between the inphase path and the quadrature path of the electronic device 102, the baseband output signal phase may be easily changed. Thus, the I/Q phase imbalance correction circuit 112 may provide selective coupling between the inphase path and the quadrature path in the electronic device 102. The residual side band (RSB) calibration circuitry 104 may employ a feedback loop using the I/Q phase imbalance detection circuit 110 and the I/Q phase imbalance correction circuit 112.

The gain change from the I/Q phase imbalance correction circuit 112 may be insignificant, even when the coupled current is large. For example, a 0.3 dB gain change may be achieved with a 10° phase imbalance compensation.

Figure 2A:
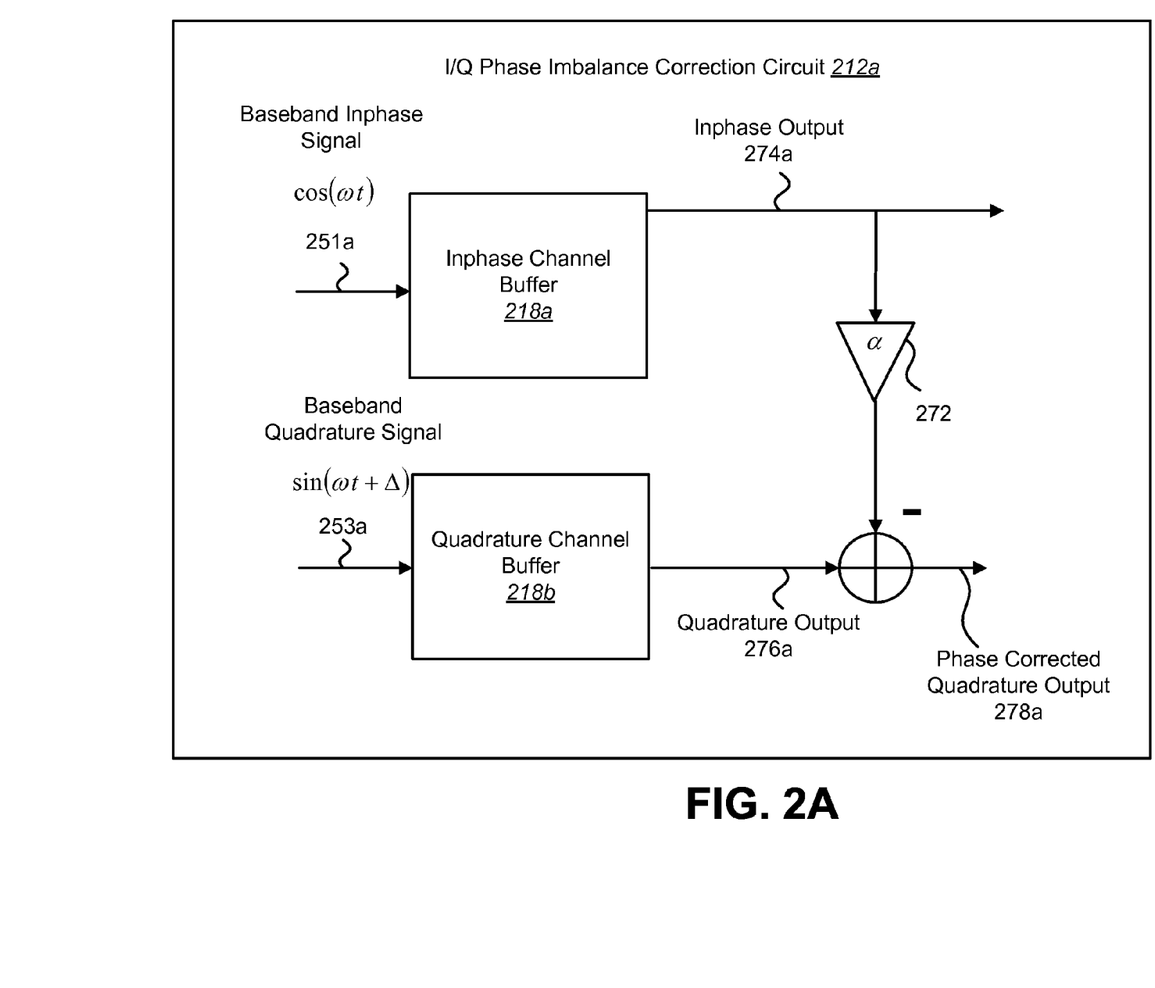
FIG. 2A is a block diagram illustrating a simplex inphase/quadrature (I/Q) phase imbalance correction circuit for use in the present systems and methods.

FIG. 2A is a block diagram illustrating a simplex I/Q phase imbalance correction circuit 212a for use in the present systems and methods. The I/Q phase imbalance correction circuit 212a of FIG. 2A may be one configuration of the I/Q phase imbalance correction circuit 112 of FIG. 1. One way to implement the I/Q phase imbalance correction circuit 212a is to couple partial signal from the inphase path to the quadrature path or from the quadrature path to the inphase path in the passive mixer. However, such a weighting function may be complicated and requires extra care to improve reverse isolation. Instead, in a current-mode application, the I/Q phase imbalance correction circuit 112 may be better implemented with current-mirror replicas. The use of current buffer replicas may be instrumental, since the interface between the current buffer and the transimpedance amplifier (TIA) is one of the best places for current summation due to the electrical characteristic at the virtual ground. Current buffer replicas may be used to achieve nearly ideal reverse isolation (to prevent unwanted complex filters from occurring). Each current buffer replica may be implemented using a generic amplifier.

The I/Q phase imbalance correction circuit 212a may include an inphase channel buffer 218a and a quadrature channel buffer 218b. Both the inphase channel buffer 218a and the quadrature channel buffer 218b may be current buffers, voltage buffers, etc. The inphase channel buffer 218a may receive a baseband inphase signal cos(ωt) 251a. The quadrature channel buffer 218b may receive a baseband quadrature signal sin(ωt+Δ) 253a. The inphase channel buffer 218a may output an inphase output 274a represented by cos(ωt).

The quadrature channel buffer 218b may output a quadrature output 276a. The inphase output 274a may be passed through a gain stage 272 and then subtracted from the quadrature output 276a using an adder to obtain a phase corrected quadrature output 278a as given in Equation (2):

$$PCQO = \sin(\omega t + \Delta) - \alpha\cos(\omega t) \qquad (2)$$
$$= \sin(\omega t)\cos(\Delta) + \cos(\omega t)\sin(\Delta) - \alpha\cos(\omega t).$$

If $\sin(\Delta)=\alpha$, then Equation (2) may be rewritten as Equation (3):

$$PCQO = \sin(\omega t)\cos(\Delta) \qquad (3)$$
$$= \sqrt{1-\alpha^2}\sin(\omega t).$$

Figure 2B:
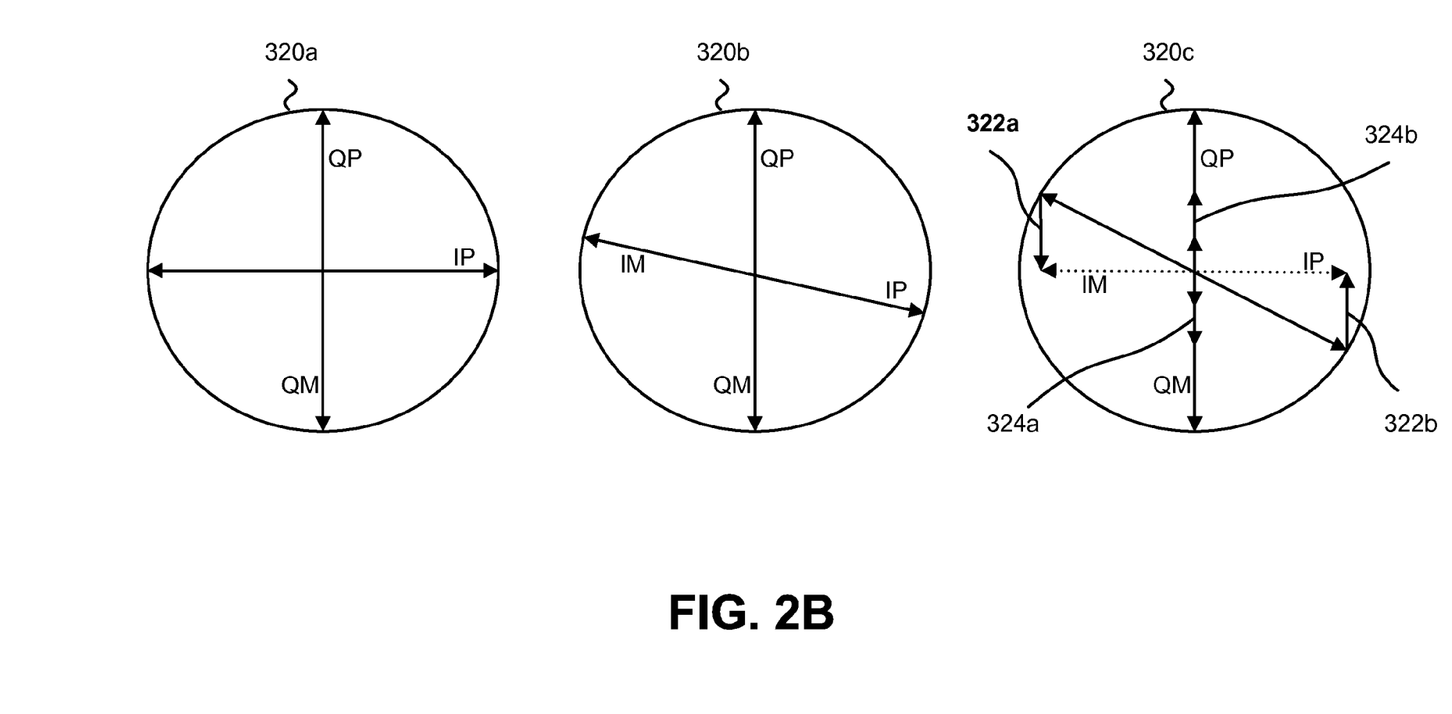
FIG. 2B is a block diagram illustrating a duplex I/Q phase imbalance correction circuit for use in the present systems and methods

FIG. 2B illustrates angle addition formulas for an I/Q phase imbalance correction circuit 212a. In the first diagram 320a, vectors for a balanced inphase path and quadrature path are shown (with 90° separation). In the second diagram 320b, a phase imbalance is illustrated by the tilt of the vector between the negative inphase signal (IM) and the positive inphase signal (IP). In the third diagram 320c, the changes 322a-b needed to remove the phase imbalance are shown. Specifically, coupling from the quadrature channel current buffer 218b (via a replica) may be provided to both the positive inphase signal path and the negative inphase signal path, reducing the phase imbalance.

If only simplex phase imbalance correction is employed (as shown in the third diagram 320c) to adjust the phase imbalance of the inphase path, the amplitude 324a-b of the inphase path may be changed, which may be undesirable as changing the amplitude introduces additional gain imbalance. Thus, the use of dual-side (also referred to as dual direction) I/Q coupling (as illustrated in FIGS. 3 and 4) may be more desirable.

Figure 3:
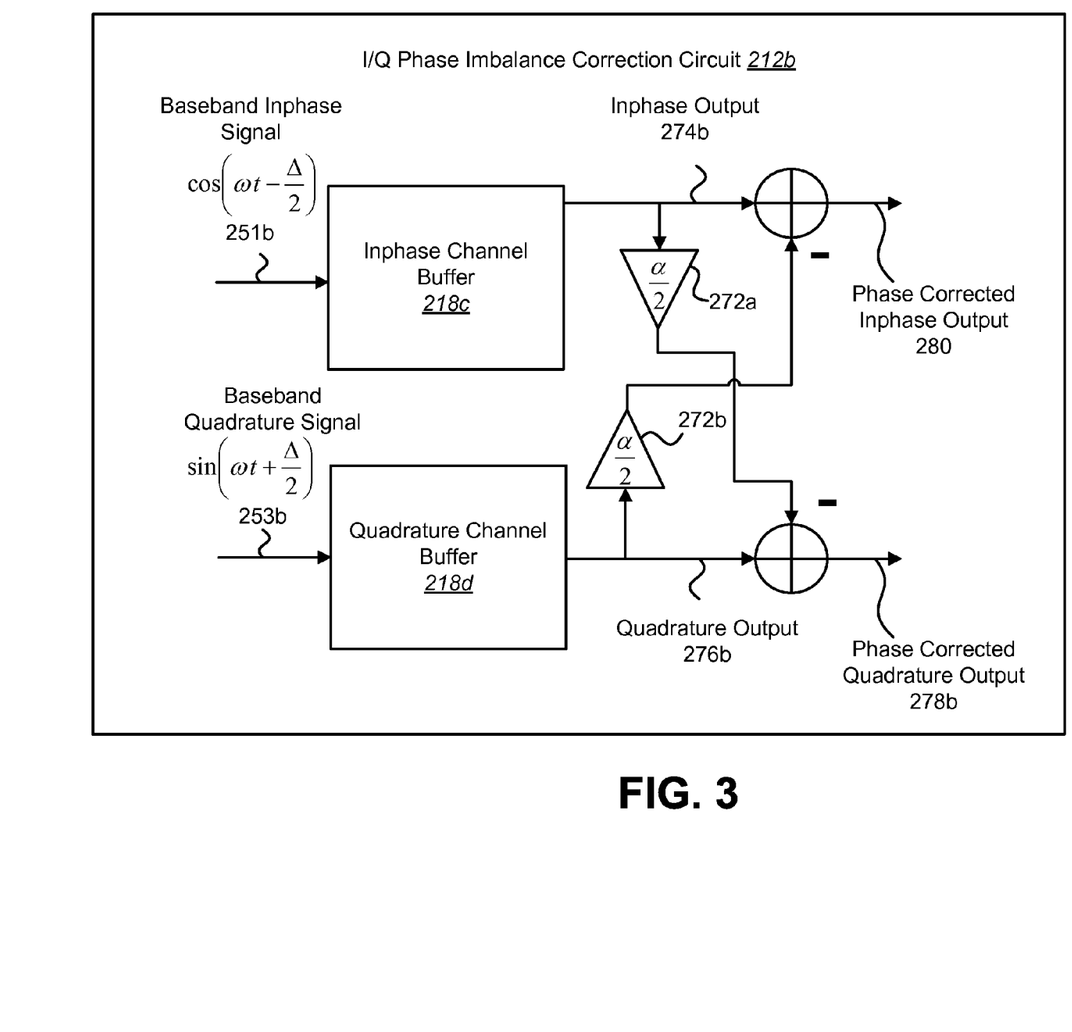
FIG. 3 illustrates angle addition formulas for an I/Q phase imbalance correction circuit.
Figure 4:
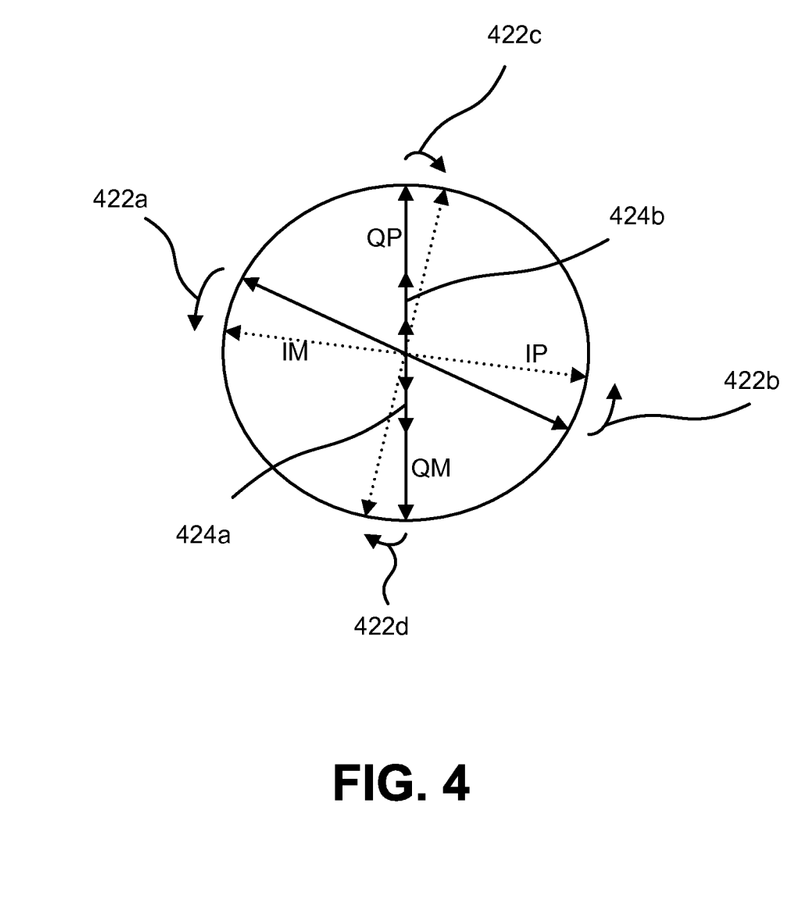
FIG. 4 illustrates angle addition formulas for an I/Q phase imbalance correction circuit using dual-side I/Q coupling.

FIG. 3 is a block diagram illustrating a duplex I/Q phase imbalance correction circuit 212b for use in the present systems and methods. The I/Q phase imbalance correction circuit 212b of FIG. 2B may be one configuration of the I/Q phase imbalance correction circuit 112 of FIG. 1.

The I/Q phase imbalance correction circuit 212b may include an inphase channel buffer 218c and a quadrature channel buffer 218d. Both the inphase channel buffer 218c and the quadrature channel buffer 218d may be current buffers, voltage buffers, etc. The inphase channel buffer 218c may receive a baseband inphase signal $$\cos\left(\omega t - \frac{\Delta}{2}\right) 251b.$$

The quadrature channel buffer 218d may receive a baseband quadrature signal $$\sin\left(\omega t + \frac{\Delta}{2}\right) 253b.$$

The phase imbalance is given by $\Delta$. The inphase channel buffer 218c may output an inphase output 274b. The quadrature channel buffer 218d may output a quadrature output 276b.

The inphase output 274b (also referred to as the inphase buffer replica) may be passed through a gain stage $$\frac{\alpha}{2} 272a$$

and then subtracted from the quadrature output 276b (also referred to as the quadrature buffer output) using an adder to obtain a phase corrected quadrature output 278b as given in Equation (4):

$$PCQO = \sin\left(\omega t + \frac{\Delta}{2}\right) - \frac{\alpha}{2}\cos\left(\omega t - \frac{\Delta}{2}\right) \qquad (4)$$
$$= \cos(\omega t)\sin\left(\frac{\Delta}{2}\right) + \sin(\omega t)\cos\left(\frac{\Delta}{2}\right) - \frac{\alpha}{2}\cos(\omega t)\cos\left(\frac{\Delta}{2}\right) -$$
$$\frac{\alpha}{2}\sin(\omega t)\sin\left(\frac{\Delta}{2}\right).$$

Equation (4) can then be rewritten as Equation (5):

$$PCQO = \sin(\omega t)\left(\cos\left(\frac{\Delta}{2}\right) - \frac{\alpha}{2}\sin\left(\frac{\Delta}{2}\right)\right) + \cos(\omega t)\left(\sin\left(\frac{\Delta}{2}\right) - \frac{\alpha}{2}\cos\left(\frac{\Delta}{2}\right)\right). \qquad (5)$$

In Equation (5), $$\sin\left(\frac{\Delta}{2}\right) - \frac{\alpha}{2}\cos\left(\frac{\Delta}{2}\right) = 0.$$

Thus, $$\alpha\cos\left(\frac{\Delta}{2}\right) = 2\sin\left(\frac{\Delta}{2}\right),$$

and $$\alpha = \frac{2\sin\left(\frac{\Delta}{2}\right)}{\cos\left(\frac{\Delta}{2}\right)} = 2\cdot\tan\frac{\Delta}{2}.$$

Figure 5:
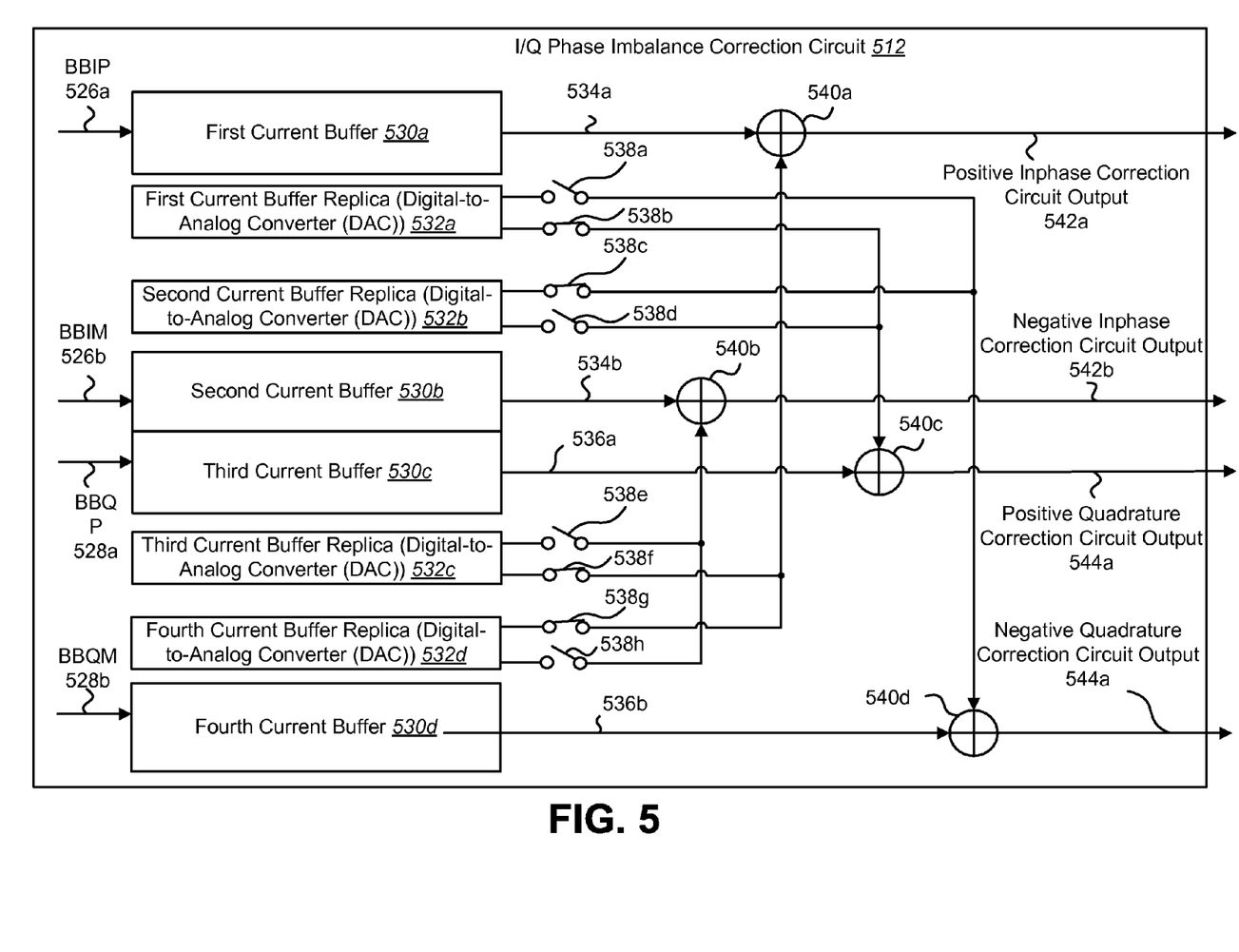
FIG. 5 is a more detailed block diagram illustrating an I/Q phase imbalance correction circuit.

Since it may be desirable for the quadrature portion to be $\sin(\omega t)$, this portion may be set to 0 in an effort to focus on the $\cos(\omega t)$ portion of FIG. 5.

Equation (5) may then be rewritten to give the phase corrected quadrature output 278b of Equation (6):

$$PCQO = \sin(\omega t)\left(\cos\left(\frac{\Delta}{2}\right) - \frac{\alpha}{2}\sin\left(\frac{\Delta}{2}\right)\right). \qquad (6)$$

Likewise, the quadrature output 276b (also referred to as the quadrature buffer replica) may be passed through a gain stage $$\frac{\alpha}{2} 272b$$

and then subtracted from the inphase output 274b (also referred to as an inphase buffer output) using an adder to obtain a phase corrected inphase output 280 as given in Equation (7):

$$PCIO = \cos\left(\omega t - \frac{\Delta}{2}\right) - \frac{\alpha}{2}\sin\left(\omega t + \frac{\Delta}{2}\right) \quad (7)$$

$$= \cos(\omega t)\cos\left(\frac{\Delta}{2}\right) + \sin(\omega t)\sin\left(\frac{\Delta}{2}\right) -$$

$$\frac{\alpha}{2}\sin(\omega t)\cos\left(\frac{\Delta}{2}\right) - \frac{\alpha}{2}\cos(\omega t)\sin\left(\frac{\Delta}{2}\right).$$

Equation (7) can then be rewritten as Equation (8):

$$PCIO = \cos(\omega t)\left(\cos\left(\frac{\Delta}{2}\right) - \frac{\alpha}{2}\sin\left(\frac{\Delta}{2}\right)\right) + \sin(\omega t)\left(\sin\left(\frac{\Delta}{2}\right) - \frac{\alpha}{2}\cos\left(\frac{\Delta}{2}\right)\right). \quad (8)$$

As discussed above, $$\alpha = 2 \cdot \tan\frac{\Delta}{2}.$$

thus, the phase corrected inphase output 280 is given in Equation (9):

$$PCIO = \cos(\omega t)\left(\cos\left(\frac{\Delta}{2}\right) - \frac{\alpha}{2}\sin\left(\frac{\Delta}{2}\right)\right). \quad (9)$$

From Equation (6) and Equation (9), the amplitudes of the phase corrected inphase output 280 and the phase corrected quadrature output 278b may now be balanced while the phase imbalances may be canceled.

FIG. 4 illustrates angle addition formulas for an I/Q phase imbalance correction circuit 212b using dual-side I/Q coupling. The phase imbalance may be reduced by providing coupling from the quadrature path to the inphase path and coupling from the inphase path to the quadrature path, thereby correcting 422a-b the phase imbalance for the inphase path and correcting 422c-d the phase imbalance for the quadrature path. Using dual-side I/Q coupling may prevent an additional I/Q gain calibration after the I/Q phase calibration (since both vectors see the same change 424a-b in amplitude).

FIG. 5 is a more detailed block diagram illustrating an I/Q phase imbalance correction circuit 512. The I/Q phase imbalance correction circuit 512 may include four current buffers 530a-d. The first current buffer 530a may receive a baseband positive inphase signal (BBIP) 526a. The second current buffer 530b may receive a baseband negative inphase signal (BBIM) 526b. The third current buffer 530c may receive a baseband positive quadrature signal (BBQP) 528a. The fourth current buffer 530d may receive a baseband negative quadrature signal (BBQM) 528b. The current buffers 530 may be part of the baseband transceiver.

Each current buffer 530 may be associated with a corresponding current buffer replica 532a-d. A current buffer replica 532 can be regarded as a gain or an attenuator stage with nearly ideal reverse isolation. The current buffer replica 532 may increase isolation when providing coupling between the quadrature path and the inphase path (thereby avoiding undesired complex poles or zeroes). Each current buffer replica 532 may include a digital-to-analog converter (DAC) with a weight of 0-25% and 4 to 4N bit programmability to cover at least 0.5° resolution. Each current buffer replica 532 should be designed cover up to the theoretical maximum degrees of phase imbalance.

The first current buffer 530a may output a positive inphase current-mode output 534a to a first adder 540a. The first adder 540a may output a positive inphase correction circuit output 542a. The second current buffer 530b may output a negative inphase current-mode output 534b to a second adder 540b. The second adder 540b may output a negative inphase correction circuit output 542b. The third current buffer 530c may output a positive quadrature current-mode output 536a to a third adder 540c. The third adder 540c may output a positive quadrature correction circuit output 544a. The fourth current buffer 530d may output a negative quadrature current-mode output 536b to a fourth adder 540d. The fourth adder 540d may output a negative quadrature correction circuit output 544b.

Each current buffer replica 532 may include a positive output and a negative output that facilitates I/Q coupling. One output of the first current buffer replica 532a may be coupled to the fourth adder 540d via a first switch 538a. Another output of the first current buffer replica 532a may be coupled to the third adder 540c via a second switch 538b. One output of the second current buffer replica 532b may be coupled to the fourth adder 540d via a third switch 538c. Another output of the second current buffer replica 532b may be coupled to the third adder 540c via a fourth switch 538d.

One output of the third current buffer replica 532c may be coupled to the second adder 540b via a fifth switch 538e. Another output of the third current buffer replica 532c may be coupled to the first adder 540a via a sixth switch 538f. One output of the fourth current buffer replica 532d may be coupled to the first adder 540a via a seventh switch 538g. Another output of the fourth current buffer replica 532d may be coupled to the second adder 540b via an eighth switch 538h. Each of the switches 538 may be controlled by a controller, which is discussed below in relation to FIG. 6.

Figure 6:
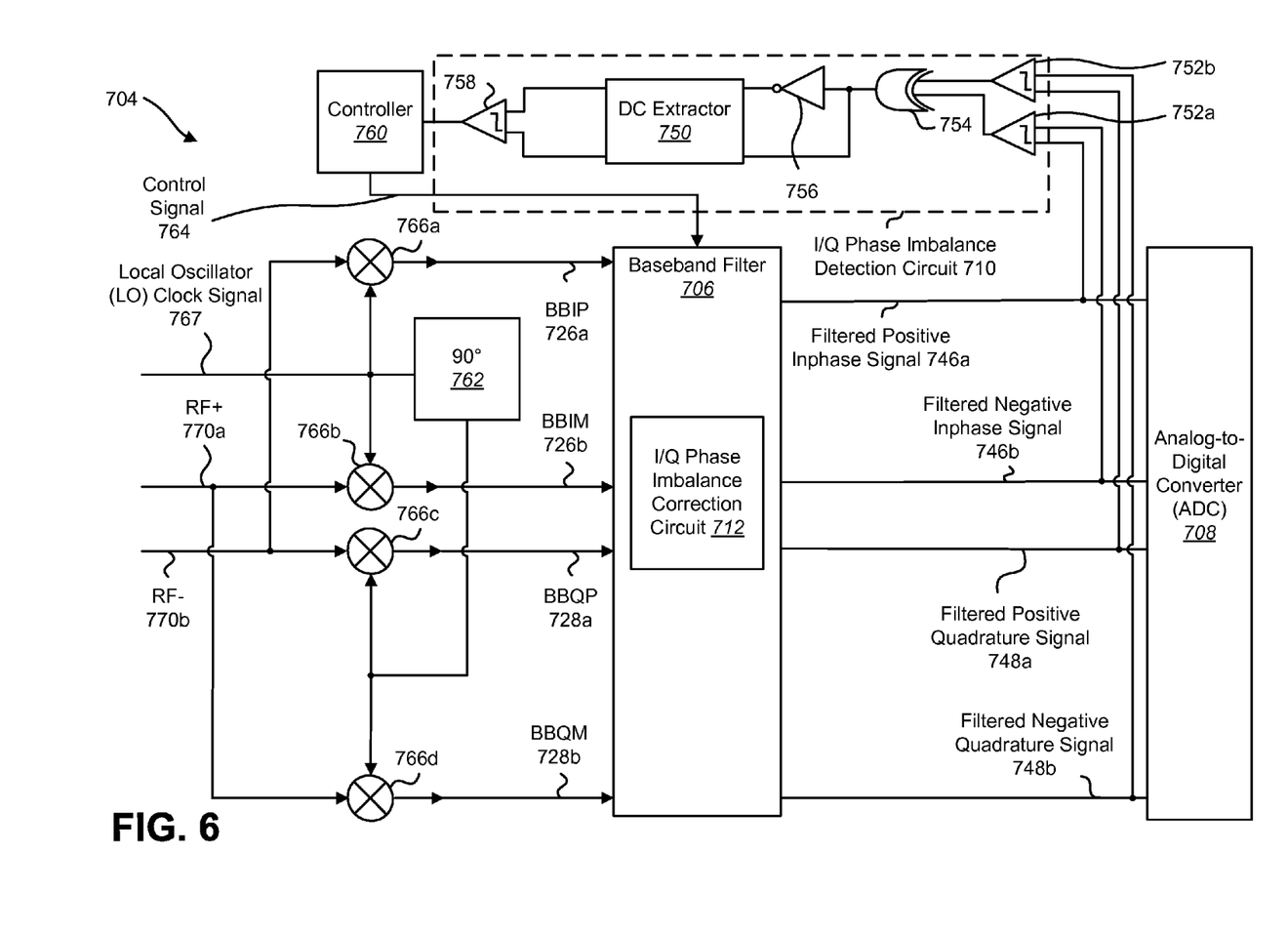
FIG. 6 is a circuit diagram illustrating one configuration of residual side band (RSB) calibration circuitry.

FIG. 6 is a circuit diagram illustrating one configuration of residual side band (RSB) calibration circuitry 704. The RSB calibration circuitry 704 of FIG. 6 may be one configuration of the RSB calibration circuitry 104 of FIG. 1. The RSB calibration circuitry 704 may include an I/Q phase imbalance correction circuit 712 as described above in relation to FIG. 5. The RSB calibration circuitry 704 may also include an I/Q phase imbalance detection circuit 710. The RSB calibration circuitry 704 may further include an I/Q amplitude imbalance correction circuit (not shown) and an I/Q amplitude imbalance detection circuit (not shown).

The I/Q phase imbalance correction circuit 712 may be part of a baseband filter 706. The baseband filter 706 may receive a baseband positive inphase signal (BBIP) 726a, a baseband negative inphase signal (BBIM) 726b, a baseband positive quadrature signal (BBQP) 728a and a baseband negative quadrature signal ((BBQM) 728b. Using a 90 degree phase shift 762 powered by the local oscillator (LO) clock signal 767 and multiple mixers 766a-d, the positive RF signal (RF+) 770a and the negative RF signal (RF−) 770b may be used to generate the BBIP 726a, the BBIM 726b, the BBQP 728a, and the BBQM 728b.

The baseband filter 706 may output a filtered positive inphase signal 746a, a filtered negative inphase signal 746b, a filtered positive quadrature signal 748a and a filtered negative quadrature signal 748b. The filtered positive inphase signal 746a, the filtered negative inphase signal 746b, the filtered positive quadrature signal 748a and the filtered negative quadrature signal 748b may be provided to an analog-to-digital converter (ADC) 708 and to the I/Q phase imbalance detection circuit 710. In one configuration, additional filtering may be performed on the outputs of the baseband filter 706.

The I/Q phase imbalance detection circuit 710 may include a first limiter 752a and a second limiter 752b. The first limiter 752a may receive the filtered positive inphase signal 746a and the filtered negative inphase signal 746b. The second limiter 752b may receive the filtered positive quadrature signal 748a and the filtered negative quadrature signal 748b. The output of the first limiter 752a and the output of the second limiter 752b may be provided to the inputs of an XOR gate 754.

The output of the XOR gate 754 may be coupled directly to a DC extractor 750 and to the DC extractor 750 via an inverter 756. The DC extractor 750 may only preserve DC signals. The outputs of the DC extractor 750 may be provided to a comparator 758. In one configuration, the comparator 758 may be an analog-to-digital converter (ADC) or a quantizer. The output of the comparator 758 may reflect the phase imbalance between the quadrature path and the inphase path. The output of the comparator 758 may be provided to a controller 760. In one configuration, the controller 760 may be a successive approximation register (SAR) engine. The controller 760 may provide a control signal 764 to the I/Q phase imbalance correction circuit 712 enabling/disabling coupling between the inphase path and the quadrature path. In one configuration, the control signal 764 may be 4 bits.

Figure 7:
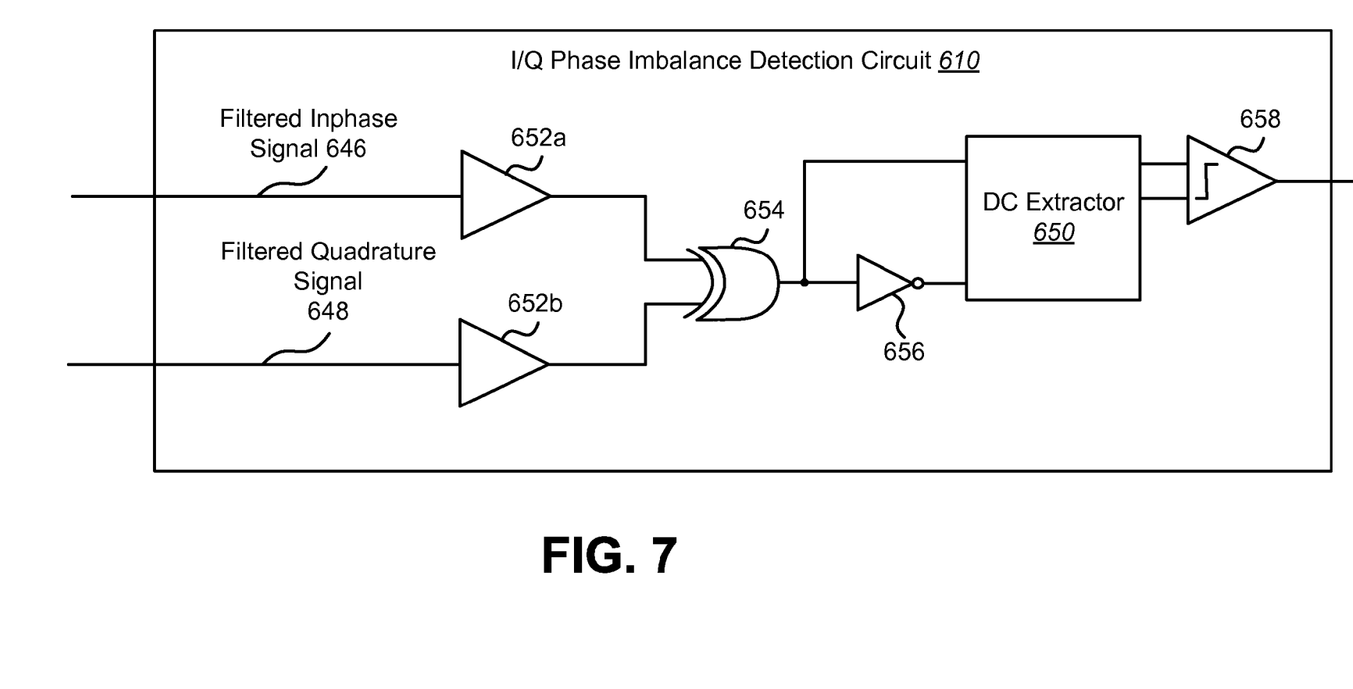
FIG. 7 is a circuit diagram illustrating one configuration of RSB calibration circuitry.

FIG. 7 is a circuit diagram of an I/Q phase imbalance detection circuit 610. The I/Q phase imbalance detection circuit 610 of FIG. 7 may be one configuration of the I/Q phase imbalance detection circuit 110 of FIG. 1. The I/Q phase imbalance detection circuit 610 may receive a filtered inphase signal 646 and a filtered quadrature signal 648.

The filtered inphase signal 646 may be provided to a first limiter 652a. The filtered quadrature signal 648 may be provided to a second limiter 652b. The output of the first limiter 652a and the output of the second limiter 652b may be provided to the inputs of an XOR gate 654. The outputs of an XOR gate 654 and an XNOR gate may be nearly differential after passing through a DC extractor 650. Thus, instead of comparing either side with VDD/2 (which may be difficult to generate), a comparison may be made between the XOR gate 654 output and an XNOR output (which may be realized by passing the output of the XOR gate 654 through an inverter 656). The filtered baseband inphase signal 646 may be represented by $\cos(\omega t)$ and the filtered quadrature signal 648 may be represented by $\sin(\omega t + \Delta)$.

The output of the first limiter 652a is $$\frac{4}{\pi}\left(\cos(\omega t) + \frac{1}{3}\cos(3\omega t) + \frac{1}{5}\cos(5\omega t) + \ldots\right).$$

The output of the second limiter 652b is $$\frac{4}{\pi}\left(\sin(\omega t + \Delta) + \frac{1}{3}\sin(3\omega t + \Delta) + \frac{1}{5}\sin(5\omega t + \Delta) + \ldots\right).$$

The output of the XOR gate 654 is given in Equation (10):

$$XORoutput = \frac{4}{\pi} \cdot \frac{4}{\pi}\left(\cos(\omega t) + \frac{1}{3}\cos(3\omega t) + \ldots\right) \quad (10)$$
$$\left(\sin(\omega t + \Delta) + \frac{1}{3}\sin(3\omega t + \Delta) + \ldots\right).$$

Equation (10) may be rewritten (ignoring the high order harmonics) as Equation (11):

$$XORoutput = \frac{16}{\pi^2}(\cos(\omega t)(\sin(\omega t)\cos(\Delta) + \cos(\omega t)\sin(\Delta)) + \ldots) \quad (11)$$
$$= \frac{16}{\pi^2}\left(\frac{\sin(2\omega t)}{2}\cos(\Delta) + \frac{1 - \cos(2\omega t)}{2}\sin(\Delta) + \ldots\right).$$

After being passed through a DC extractor 650 (such as a low pass filter or an RC passive filter), Equation (11) becomes Equation (12):

$$\left[\frac{1}{2}\cos(\Delta)\right]. \quad (12)$$

The XNOR output (e.g. the output of the inverter 656) after the DC extractor 650 is $$1 - \left[\frac{1}{2}\cos(\Delta)\right].$$

If $\Delta=0$ (because there is no phase imbalance) and there is no DC offset, then the multiplication of the filtered inphase signal 646 and the filtered quadrature signal 648 is equal to ½ on both the XOR gate 654 output and the XNOR gate (via the inverter 656) output.

The output of the XOR gate 654 may be coupled to a first input of a comparator 658 via the DC extractor 650. The output of the inverter 656 may be coupled to a second input of the comparator 658 via the DC extractor 650.

Figure 8:
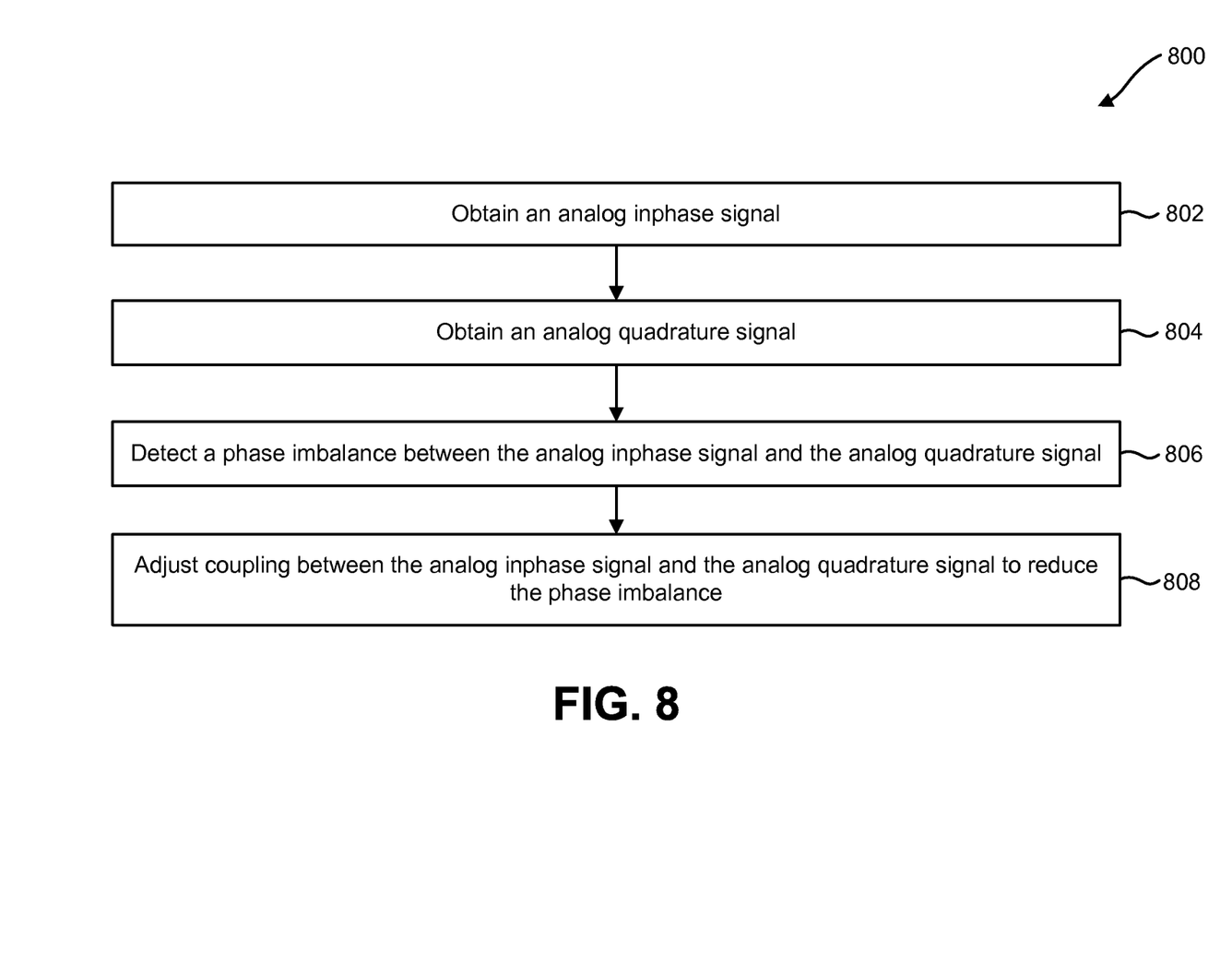
FIG. 8 is a flow diagram of a method for reducing I/Q phase imbalance.

FIG. 8 is a flow diagram of a method 800 for reducing I/Q phase imbalance. The method 800 may be performed by an electronic device 102. In one configuration, the electronic device 102 may include residual side band (RSB) calibration circuitry 104. The I/Q phase imbalance reduction may be performed in the analog domain. The electronic device 102 may obtain 802 an analog inphase signal. The electronic device 102 may also obtain 804 an analog quadrature signal. The electronic device 102 may detect 806 a phase imbalance between the analog inphase signal and the analog quadrature signal. For example, the electronic device 102 may detect 806 a phase imbalance using an I/Q phase imbalance detection circuit 110. The electronic device 102 may adjust 808 coupling between the analog inphase signal and the analog quadrature signal to reduce the phase imbalance. For example, a controller 760 may adjust switches 538 within an I/Q phase imbalance correction circuit 512 to provide coupling from the analog inphase signal to the analog quadrature signal and/or to provide coupling from the analog quadrature signal to the analog inphase signal. In one configuration, the coupling may use signals from current buffer replicas 532 to increase isolation.

Figure 9:
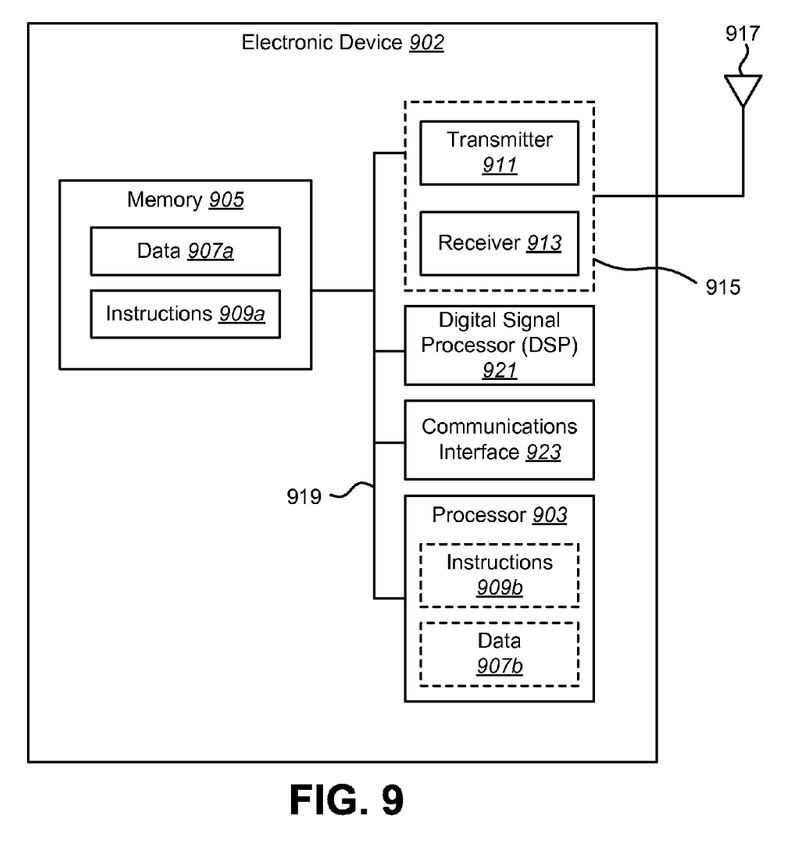
FIG. 9 illustrates various components that may be utilized in an electronic device.

FIG. 9 illustrates certain components that may be included within an electronic device 902 according to some configurations of the present systems and methods. The electronic device 902 may be an access terminal, a mobile station, a user equipment (UE), a laptop, a base station, etc. The electronic device 902 includes a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the electronic device 902 of FIG. 9, in an alternative configuration, a combination of processors (e.g., an ARM and DSP) could be used.

The electronic device 902 also includes memory 905. The memory 905 may be any electronic component capable of storing electronic information. The memory 905 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 907a and instructions 909a may be stored in the memory 905. The instructions 909a may be executable by the processor 903 to implement the methods disclosed herein. Executing the instructions 909a may involve the use of the data 907a that is stored in the memory 905. When the processor 903 executes the instructions 909, various portions of the instructions 909b may be loaded onto the processor 903, and various pieces of data 907b may be loaded onto the processor 903.

The electronic device 902 may also include a transmitter 911 and a receiver 913 to allow transmission and reception of signals to and from the electronic device 902 via an antenna 917. The transmitter 911 and receiver 913 may be collectively referred to as a transceiver 915. The residual side band (RSB) calibration circuitry 104 (including the I/Q phase imbalance detection circuit 110 and the I/Q phase imbalance correction circuit 112) may be included within the transceiver 915. The electronic device 902 may also include (not shown) multiple transmitters, multiple antennas, multiple receivers, and/or multiple transceivers.

The electronic device 902 may include a digital signal processor (DSP) 921. The electronic device 902 may also include a communications interface 923. The communications interface 923 may allow a user to interact with the electronic device 902.

The various components of the electronic device 902 may be coupled together by one or more buses, which may include a power bus, a control signal bus, a status signal bus, a data bus, etc. For the sake of clarity, the various buses are illustrated in FIG. 9 as a bus system 919.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

It should be noted that one or more of the features, functions, procedures, components, elements, structures, etc., described in connection with any one of the configurations described herein may be combined with one or more of the functions, procedures, components, elements, structures, etc., described in connection with any of the other configurations described herein, where compatible. In other words, any compatible combination of the functions, procedures, components, elements, etc., described herein may be implemented in accordance with the systems and methods disclosed herein.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and BLU-RAY® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A circuit for performing a phase imbalance calibration, comprising:
   a phase imbalance detection circuit comprising a limiter, wherein the phase imbalance detection circuit is independent of gain imbalance; and
   a phase imbalance correction circuit, wherein the phase imbalance detection circuit generates a control signal that adjusts coupling between an inphase path and a quadrature path to reduce a phase imbalance, wherein the phase imbalance correction circuit comprises multiple switches, wherein each switch is controlled by the control signal, and wherein each switch provides the coupling when closed.

2. The circuit of claim 1, wherein the phase imbalance correction circuit comprises an inphase channel buffer and a quadrature channel buffer.

3. The circuit of claim 2, wherein the coupling occurs between an output of an inphase buffer replica and an output of the quadrature channel buffer.

4. The circuit of claim 2, wherein the coupling occurs between an output of a quadrature buffer replica and an output of the inphase channel buffer.

5. The circuit of claim 1, wherein the phase imbalance correction circuit operates in the analog domain in a baseband filter.

6. The circuit of claim 1, wherein the phase imbalance detection circuit receives analog signals output from a baseband filter.

7. The circuit of claim 1, wherein the phase imbalance detection circuit comprises:
- a first limiter that receives an inphase signal;
- a second limiter that receives a quadrature signal;
- an XOR gate that receives an output of the first limiter and an output of the second limiter; and
- a comparator that receives an output of the XOR gate and an inverted output of the XOR gate.

8. The circuit of claim 7, wherein the output of the XOR gate and the inverted output of the XOR gate are passed through a DC extractor prior to being provided to the comparator.

9. The circuit of claim 7, wherein the comparator outputs an analog signal indicating the phase imbalance in an electronic device.

10. The circuit of claim 9, wherein a controller uses the analog signal indicating the phase imbalance to adjust the coupling and reduce the phase imbalance.

11. The circuit of claim 1, wherein the coupling uses dual direction coupling both from the inphase path to the quadrature path and from the quadrature path to the inphase path.

12. A method for residual side band calibration, comprising:
- obtaining an analog inphase signal;
- obtaining an analog quadrature signal;
- detecting a phase imbalance between the analog inphase signal and the analog quadrature signal using a phase imbalance detection circuit that comprises a limiter, wherein the phase imbalance detection circuit is independent of gain imbalance; and
- adjusting coupling between the analog inphase signal and the analog quadrature signal to reduce the phase imbalance using a phase imbalance correction circuit, wherein the phase imbalance detection circuit generates a control signal that adjusts coupling between the analog inphase signal and the analog quadrature signal, and wherein the phase imbalance correction circuit comprises multiple switches, wherein each switch is controlled by the control signal, and wherein each switch provides the coupling when closed.

13. The method of claim 12, wherein the phase imbalance correction circuit comprising an inphase channel buffer and a quadrature channel buffer.

14. The method of claim 13, wherein the coupling occurs between an output of an inphase buffer replica and an output of the quadrature channel buffer.

15. The method of claim 13, wherein the coupling occurs between an output of a quadrature buffer replica and an output of the inphase channel buffer.

16. The method of claim 13, wherein the phase imbalance correction circuit operates in the analog domain in a baseband filter.

17. The method of claim 12, wherein the phase imbalance detection circuit receives analog signals output from a baseband filter.

18. The method of claim 12, wherein the phase imbalance detection circuit comprises:
- a first limiter that receives an inphase signal;
- a second limiter that receives a quadrature signal;
- an XOR gate that receives an output of the first limiter and an output of the second limiter; and
- a comparator that receives an output of the XOR gate and an inverted output of the XOR gate.

19. The method of claim 18, wherein the output of the XOR gate and the inverted output of the XOR gate are passed through a DC extractor prior to being provided to the comparator.

20. The method of claim 18, wherein the comparator outputs an analog signal indicating the phase imbalance in an electronic device.

21. The method of claim 20, wherein a controller uses the analog signal indicating the phase imbalance to adjust the coupling and reduce the phase imbalance.

22. The method of claim 12, wherein the coupling uses dual direction coupling both from an inphase path to a quadrature path and from the quadrature path to the inphase path.

23. An apparatus, comprising:
- means for obtaining an analog inphase signal;
- means for obtaining an analog quadrature signal;
- means for detecting a phase imbalance between the analog inphase signal and the analog quadrature signal, wherein the means for detecting a phase imbalance comprises a limiter, and wherein the means for detecting a phase imbalance are independent of gain imbalance; and
- means for adjusting coupling between the analog inphase signal and the analog quadrature signal to reduce the phase imbalance, wherein the means for detecting generates a control signal that adjusts coupling between the analog inphase signal and the analog quadrature signal, and wherein the means for adjusting comprises multiple means for coupling, wherein each of the means for coupling is controlled by the control signal, and wherein each of the means for coupling provides the coupling when closed.

24. The apparatus of claim 23, wherein the means for adjusting comprises an inphase channel buffer and a quadrature channel buffer.

25. The apparatus of claim 23, wherein the coupling occurs between an output of an inphase buffer replica and an output of the quadrature buffer.

26. The apparatus of claim 23, wherein the coupling occurs between an output of a quadrature buffer replica and an output of the inphase channel buffer.

27. A non-transitory tangible computer-readable medium having instructions thereon, the instructions comprising:
- code for causing an electronic device to obtain an analog inphase signal;
- code for causing the electronic device to obtain an analog quadrature signal;
- code for causing the electronic device to detect a phase imbalance between the analog inphase signal and the analog quadrature signal using a phase imbalance detection circuit that comprises a limiter, wherein the phase imbalance detection circuit is independent of gain; and
- code for causing the electronic device to adjust coupling between the analog inphase signal and the analog quadrature signal to reduce the phase imbalance, wherein the electronic device generates a control signal that adjusts coupling between the analog inphase signal and the analog quadrature signal, and wherein the electronic device comprises multiple switches, wherein each switch is controlled by the control signal, and wherein each switch provides the coupling when closed.

* * * * *